United States Patent
Ando et al.

(10) Patent No.: US 10,608,179 B2
(45) Date of Patent: Mar. 31, 2020

(54) RESISTIVE RANDOM ACCESS MEMORY WITH METAL FIN ELECTRODE

(71) Applicant: INTERNATIONAL BUSINESS MACHINES CORPORATION, Armonk, NY (US)

(72) Inventors: Takashi Ando, Tuckahoe, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/826,999

(22) Filed: Nov. 30, 2017

(65) Prior Publication Data
US 2019/0165269 A1 May 30, 2019

(51) Int. Cl.
*H01L 45/00* (2006.01)

(52) U.S. Cl.
CPC ......... *H01L 45/1273* (2013.01); *H01L 45/08* (2013.01); *H01L 45/085* (2013.01); *H01L 45/1233* (2013.01); *H01L 45/146* (2013.01); *H01L 45/147* (2013.01); *H01L 45/1616* (2013.01); *H01L 45/1625* (2013.01)

(58) Field of Classification Search
CPC . H01L 45/124; H01L 45/1273; H01L 45/146; H01L 45/1233; H01L 45/085
See application file for complete search history.

(56) References Cited

U.S. PATENT DOCUMENTS

| 8,000,128 B2* | 8/2011 | Li | G11C 13/0007 365/148 |
| 8,742,390 B1* | 6/2014 | Tu | H01L 45/04 257/4 |
| 2015/0311435 A1* | 10/2015 | Liu | H01L 45/1233 257/4 |
| 2016/0181517 A1* | 6/2016 | Zhou | G11C 13/0007 365/148 |

OTHER PUBLICATIONS

Pan, H. W. et al., "1Kbit FINFET Dielectric (FIND) RRAM in Pure 16nm FinFET CMOS Logic Process" IEEE International Electron Devices Meeting (IEDM) (Dec. 2015) pp. 10.51-10.5.4.

* cited by examiner

*Primary Examiner* — Allison Bernstein
(74) *Attorney, Agent, or Firm* — Tutunjian & Bitetto, P.C.; L. Jeffrey Kelly

(57) ABSTRACT

A memory device including a lower electrode having an upper portion extending above an upper surface of a first dielectric layer, wherein the upper portion of the lower electrode has corners that are exposed. The memory device also includes a metal oxide layer having a conformal thickness present on sidewalls of the upper portion of the lower electrode. The metal oxide layer is present on at least the corners of the lower electrode that extend above the first dielectric layer. The memory device may also include an upper electrode present on the metal oxide layer. The upper electrode being separated from an entirety of the lower electrode by the metal oxide layer. In some embodiments, the memory device is a resistive random access memory device. The corners of the lower electrode localize filament formation in the metal oxide layer.

11 Claims, 5 Drawing Sheets

RESISTIVE RANDOM ACCESS MEMORY WITH METAL FIN ELECTRODE

BACKGROUND

Technical Field

The present invention relates generally to memory devices and, in particular, to a resistive switching memory device.

Description of the Related Art

One type of memory device actively developed by industries is a resistive random access memory (ReRAM), and the ReRAM has advantages such as low write-in operation voltage, short write time and erase time, long memorizing time, non-destructive read out, multi-state memory, simple structure, and small required area. The ReRAM is generally formed by a top electrode, a bottom electrode, and a dielectric layer between the top electrode and the bottom electrode.

SUMMARY

According to an aspect of the present invention, a memory device is provided. In some embodiments, the memory device includes a lower electrode having an upper portion extending above an upper surface of a first dielectric layer, wherein the upper portion of the lower electrode has corners that are exposed. The memory device also includes a metal oxide layer having a conformal thickness present on sidewalls of the upper portion of the lower electrode. The metal oxide layer is present on at least the corners of the lower electrode that extend above the first dielectric layer. The memory device may also include an upper electrode present on the metal oxide layer. The upper electrode being separated from an entirety of the lower electrode by the metal oxide layer. In some embodiments, the memory device is a resistive random access memory device. The corners of the lower electrode localize filament formation in the metal oxide layer.

In another embodiment, the memory device includes a lower electrode present on a lower contact line, the lower electrode having an upper portion extending above an upper surface of a first dielectric layer, wherein the upper portion of the lower electrode has corners that are exposed; and a metal oxide layer having a conformal thickness present on sidewalls of the upper portion of the lower electrode. The metal oxide layer is present on at least the corners of the lower electrode that extend above the first dielectric layer. The memory device can also include an upper electrode present on the metal oxide layer. The upper electrode being separated from an entirety of the lower electrode by the metal oxide layer. The corners of the lower electrode localize filament formation in the metal oxide layer. The memory device also includes an upper contact line present on the upper electrode. The lower contact line and the upper contact line are orientated to provide a cross-bar architecture.

According to another aspect of the present invention, a method of forming a memory device is provided that includes forming lower contact lines in a trench formed in first dielectric layer; and recessing the lower contact lines within the trench to form a recess at an upper portion of the trench. A lower electrode is formed in the recess at the upper portion of the trench. The first dielectric layer is recessed to expose corners of the lower electrode. The method may further include forming a stack of a metal oxide layer and an upper electrode on a portion of the lower electrode exposed by recessing the first dielectric layer. The corners of the lower electrode localize filament formation in the metal oxide layer. The memory device may be a resistive random access memory (ReRAM) device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1A:
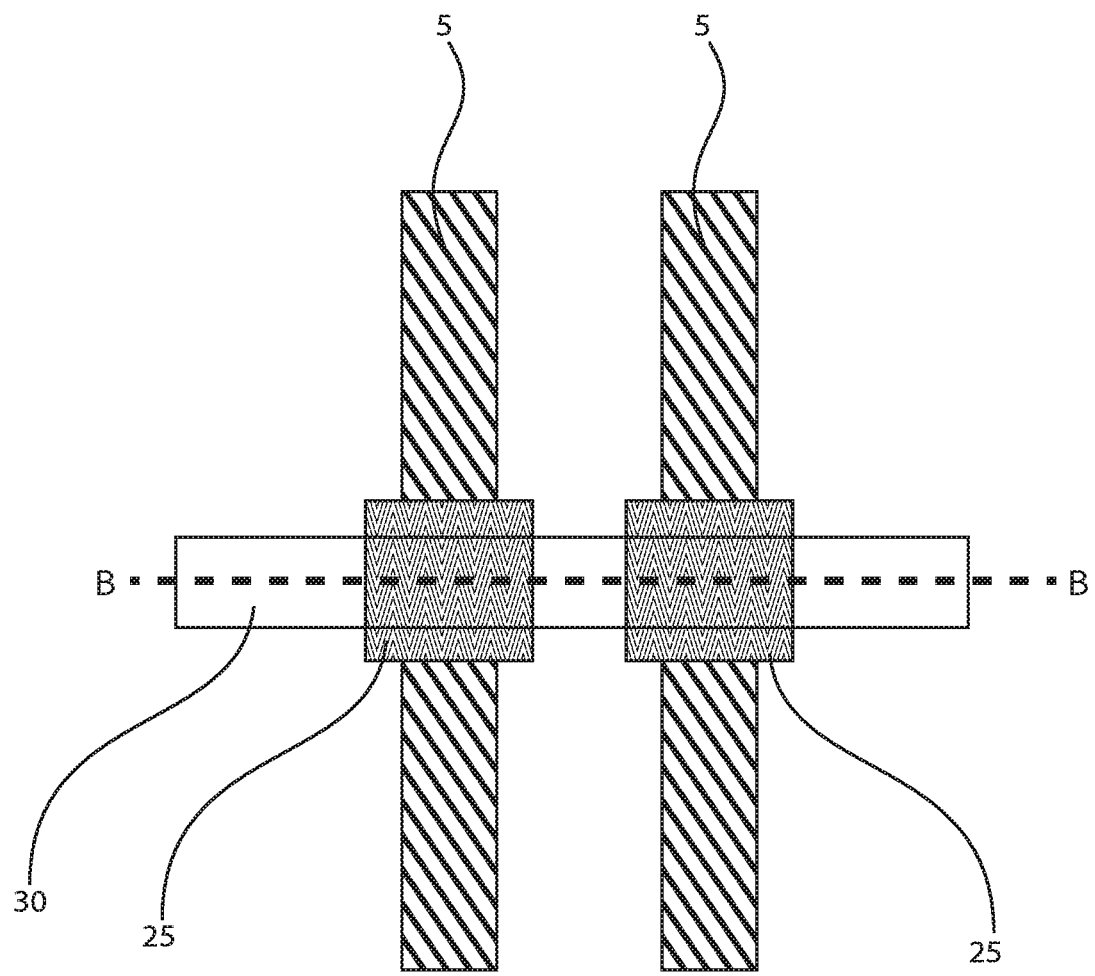
FIG. 1A is a top down view of one embodiment of a resistive random access memory (ReRAM) device having a cross-bar architecture.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is directed to a resistive switching memory devices. As used herein, the term "memory device" means a structure in which the electrical state can be altered and then retained in the altered state, in this way a bit of information can be stored. Resistive random-access memory (RRAM or ReRAM) is a type of non-volatile (NV) random-access (RAM) computer memory that works by changing the resistance across a dielectric solid-state material often referred to as a memristor. For Oxide ReRAM, electroforming of current conducting filament is needed. This process relies on randomness and the position of filament is not under control. This results in higher forming voltage as ReRAM cell is scaled and higher device variability. In some embodiments, the methods and structures of the present disclosure employ a bottom electrode having the geometry of fin structure, in which the ends of the bottom electrode extend out from an interlayer film, wherein the ends of the bottom electrode have an edge, i.e., corner, that provides for preferential filament formation. A metal oxide layer, e.g., hafnium oxide ($HfO_x$), tantalum oxide ($TaO_x$), titanium oxide ($TiO_x$) and combinations thereof, and a top electrode layer are formed surrounding the extended portion of the bottom electrode. Each resistive random access memory (ReRAM) has fin corners that provide for preferential filament formation. The fin corners are used to enhance the electrical field during some aspects of the memory device operation. The enhanced electrical filed facilitates electroforming of oxide resistive random access memory devices. The preferentially formed filaments lower the forming voltage of the resistive random access memory device; reduces device variability; and the preferentially formed filaments enhance resistive random access memory device scaling. The methods and structures of the present disclosure are now described with more detail with reference to FIGS. 1-6.

Figure 1B:
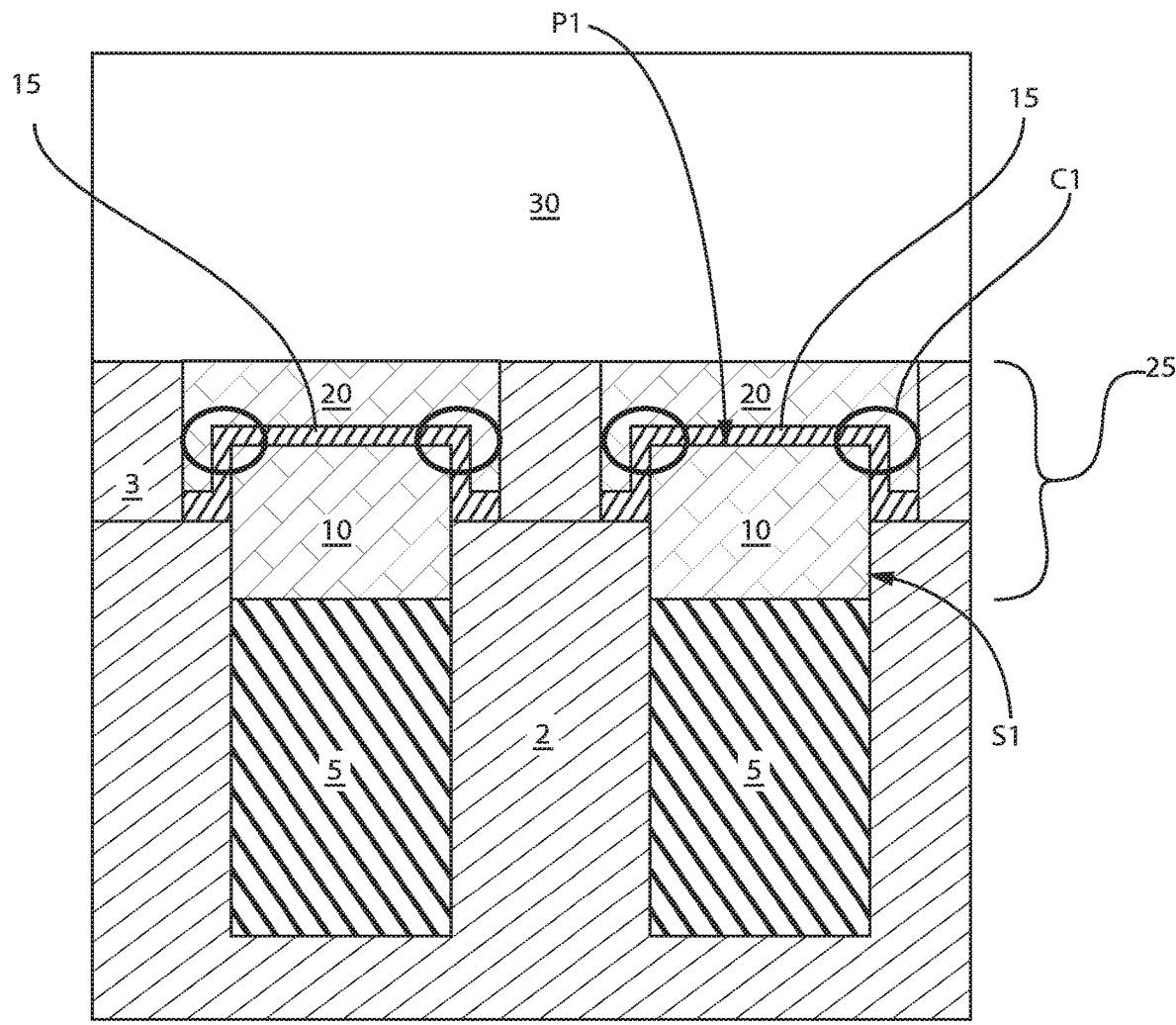
FIG. 1B is a side cross-sectional view of the resistive random access memory device (ReRAM) device that is depicted in FIG. 1 across section line B-B.

FIGS. 1A and 1B depict one embodiment of a vertical random access memory (ReRAM) device having a cross-bar architecture. The cross-bar architecture refers to the positioning of a memory cell, such as a resistive random access memory (ReRAM) cell 25, between an upper contact line 30 and a lower contact line 5, and refers to the directions of travel for the upper and lower contact lines 30, 5. Resistive random-access memory (RRAM or ReRAM) is a type of non-volatile (NV) random-access (RAM) memory that works by changing the resistance across a dielectric solid-state material. In some instances, the RRAM or ReRAM may be referred to as a memresistor.

The upper contact line 30 and the lower contact line 5 may extend along parallel planes but may have directions that are perpendicular to one another, as depicted in FIG. 1. The single resistive random access memory (ReRAM) device having the cross-bar architecture that is depicted in FIGS. 1A and 1B may be integrated into an array of like devices. In the embodiment that is depicted in FIG. 1, the upper contact line 30 is in electrical contact with an upper electrode 20 of the resistive random access memory (ReRAM) cell 25. The lower contact line 5 is in electrical contact with a lower electrode 10 of the resistive random access memory (ReRAM) cell 25.

Each of the upper contact line 30 and the lower contact line 5 may be composed of an electrically conductive material, such as a metal. Some examples of metals that are suitable for the upper contact line 30 and the lower contact line 5 may include aluminum (Al), copper (Cu), gold (Au), platinum (Pt), silver (Ag), tantalum (Ta), titanium (Ti), tungsten (W) and combinations and alloys thereof. In some examples, a nitride, e.g., titanium nitride (TiN), tantalum nitride (TaN), tungsten nitride and/or (WN), of one of the aforementioned metal examples can provide the composition for at least one of the upper contact line 30 and the lower contact line 5.

It is noted that the upper contact line 30 may also be referred to as top cross-bar line, and the lower contact line 5 may also be referred to as the bottom cross-top line.

The resistive random access memory (RRAM) device having a cross-bar architecture that is depicted in FIGS. 1A and 1B may include a lower contact line 5 that extends through an a first dielectric layer 2 (not depicted in FIG. 1A). The first dielectric layer 2 has been omitted from FIG. 1A to provide an unobstructed view of the single resistive random access memory (ReRAM) device having the cross-bar architecture, but is identified by reference number 2 in FIGS. 1B-6. The first dielectric layer 2 may be composed of any dielectric material. In some examples, the interlayer dielectric layer may have a composition that is selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H).

Additional choices for the first dielectric layer 2 include any of the aforementioned materials in porous form, or in a form that changes during processing to or from being porous and/or permeable to being non-porous and/or non-permeable.

Referring to FIG. 1A, the resistive cell 25 for the resistive random access memory (ReRAM) device is positioned between the upper contact line 30 and the lower contact line 5. The resistive cell 25 includes a lower electrode 10 that is in electrical communication with the lower metal line 5, and an upper electrode 20 that is in electrical communication with the upper metal line 30. A metal oxide layer 15 is present between and separating the lower electrode 10 from the upper electrode 20. When viewed from a top-down perspective the resistive cell 25 may have a circular, oblong, or substantially circular cross section.

Referring to FIG. 1B, the lower electrode 10 of the resistive cell 25 may include a portion that is present atop a recessed surface of the lower contact line 5, within a recess positioned between the upper surface of the first dielectric layer 2 and the recessed surface of the lower contact line 5. In one embodiment, the lower electrode 10 fills the recess and includes a portion, i.e., upper portion, that extends above the upper surface of the first dielectric layer 2. The portions of the lower electrode 10 that extends above the upper surface of the first dielectric layer 2 includes corners C1 that enhance electric field formation to provide for preferential filament formation in resistive random access memory (Re- RAM) devices. The corners C1 that provide the ends of the lower electrode 10 provide for preferential filament formation. The corners C1 are present at the intersection of the planar upper surface P1 of the lower electrode 10 and the sidewall surface S1 of the lower electrode 10 that intersect in a manner that is substantially perpendicular to one another, hence forming a corner C1. The angle defined at the intersection of the planar upper surface P1 of the lower electrode 10 of the ReRAM cell 25, and the sidewall surface S1 of the lower electrode 10 of the ReRAM cell 25 may be substantially 90 degrees. In the side cross-section that is depicted in FIG. 1B, a corner C1 is present at opposing ends of the planar upper surface P1 of the lower electrode 10.

The lower electrode 10 is composed of an electrically conductive material, such as a metal and/or metal nitride. Some examples of metals that are suitable for the lower electrode 10 may include tantalum (Ta), titanium (Ti), tungsten (W), ruthenium (Ru), and combinations and alloys thereof. In some examples, a nitride, e.g., titanium nitride (TiN), tantalum nitride (TaN), tungsten nitride and/or (WN) may be employed for the lower electrode 10.

The metal oxide layer 15 provides a filament forming layer for the memory device and is present in direct contact with the lower electrode 10 and the upper electrode 20. The metal oxide layer 15 is physically separated from the upper contact line 30 by the upper electrode 20. The metal oxide layer 15 can be physically separated from the lower contact line 5 by the lower electrode 10. As noted above, the upper electrode 20 is in direct electrical contact with the upper contact line 30, and the lower electrode 10 is in direct electrical contact with the lower contact line 5.

The metal oxide layer 15 functions as a filament forming layer of the resistive random access memory (ReRAM) cell 25. This provides that a portion of the electrical characteristics of the resistive random access memory (ReRAM) cell 25. The metal oxide layer 15 may have a conformal thickness and is present on the sidewalls S1 of the upper portion of the lower electrode 10 that extends above the upper surface of the first dielectric layer 2, and the metal oxide layer 15 is present on the planar upper surface P1 of the lower electrode 10. The metal oxide layer 15 is also present on the corners C1 of the lower electrode 10. The corners C1 of the lower electrode 10 function to enhance the electrical field during memory device operation and provide for preferential filament formation. The preferentially formed filaments lower the forming voltage of the resistive random access memory device; reduces device variability; and the preferentially formed filaments enhance resistive random access memory device scaling.

In some embodiments, the metal oxide layer 15 is composed of a composition selected from the group consisting of hafnium oxide ($HfO_2$), tantalum oxide ($Ta_2O_5$), titanium oxide ($TiO_2$), tungsten oxide ($WO_3$), zirconium oxide ($ZrO_2$), aluminum oxide ($Al_2O_3$), strontium titanium oxide ($SrTiO_3$) and combinations thereof. The metal oxide layer 15 may have a thickness ranging from 1 nm to 15 nm. In one example, the metal oxide layer 15 may be composed of hafnium oxide ($HfO_2$), and may have a thickness ranging from 3 nm to 10 nm. In another example, the metal oxide layer 15 may be composed of tantalum oxide ($Ta_2O_5$), and may have a thickness ranging from 3 nm to 10 nm.

Referring to FIG. 1B, the upper electrode 20 is in direct contact with the metal oxide layer 15, and the upper electrode 20 is in direct contact with the upper contact line 30 of the cross-bar architecture. The upper electrode 20 is composed of a metal containing composition selected from the group consisting of titanium nitride (TiN), tantalum nitride (TaN), (M)AlC, where M is a transition metal selected from the group consisting of Ti, Ta, and Nb, and combinations thereof.

The upper electrode 20 may be a single material layer, or the upper electrode 20 may be a multi-layered stack. In some embodiments, the upper electrode 20 is composed of a material stack including a titanium (Ti) rich titanium nitride (TiN) layer, and a titanium aluminum carbon containing layer, e.g., (Ti)AlC, containing stack.

The upper electrode 20, as well as the metal oxide layer 15 and the upper portion of the lower electrode 10, are present within a level of the device that includes a second dielectric layer 3. The second dielectric layer 3 is similar to the first dielectric layer 2. Therefore, the description of the composition for the first dielectric layer 2 can provide at least one embodiment for the description of the second dielectric layer 3. The upper surface of the second dielectric layer 3 may be coplanar with the upper surface of the upper electrode 20.

Referring to FIGS. 1A and 1B, the upper contact line 30 may be formed atop the planar upper surface of the upper electrode 20 of the resistive cell 25 and the second dielectric layer 3. Although not depicted in the supplied figures, the upper contact line 30 may be present within a third dielectric layer, i.e., within a trench formed in a third dielectric layer, in which the third dielectric layer has a composition similar to the composition of the first and second dielectric layers 2, 3. Some embodiments of methods for forming the resistive random access memory (ReRAM) cell 25, as depicted in FIGS. 1A and 1B, are now described with reference to FIGS. 2-6.

Figure 2:
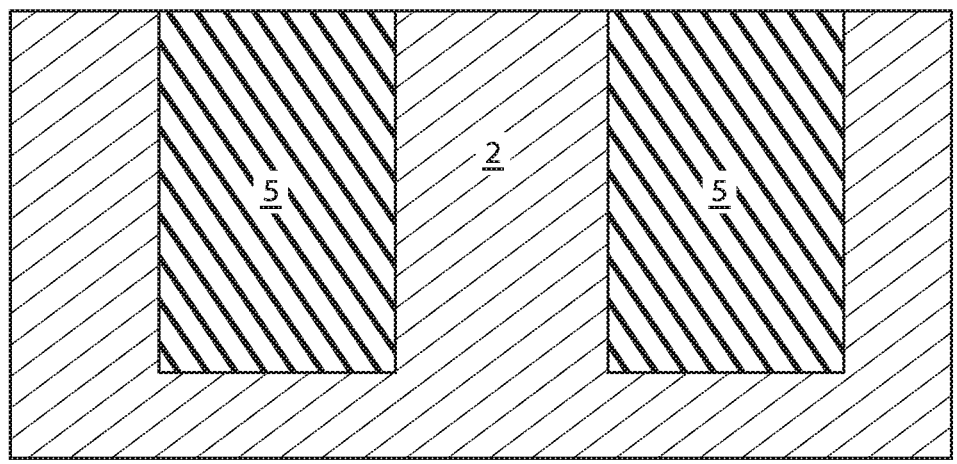
FIG. 2 is a side cross-sectional view depicting metal lines, i.e., lower contact lines, formed within an insulating material layer, i.e., first dielectric layer, which can provide one example of an initial structure for forming the resistive random access memory device that is depicted in FIGS. 1A and 1B.

FIG. 2 depicts metal lines, i.e., lower contact lines 5, formed within an insulating material layer, i.e., first dielectric layer 2, which can provide one example of an initial structure for forming the resistive random access memory device that is depicted in FIGS. 1A and 1B. The composition of the first dielectric layer 2 has been provided above in the description of the first dielectric layer 2 that is depicted in FIG. 1B.

In some embodiments, forming the lower contact lines 5 may begin with forming a trench in the first dielectric layer 2. The trench may be formed using deposition, photolithography and etching processes. Specifically, a pattern is produced by applying a photoresist to the surface to be etched; exposing the photoresist to a pattern of radiation having a geometry corresponding to the trenches; and then developing the pattern into the photoresist utilizing a resist developer. Once the patterning of the photoresist is completed, the sections covered by the photoresist are protected while the exposed regions are removed using a selective etching process that removes the unprotected regions. The process may continue with etching a trench into the first dielectric layer utilizing a dry etching process, such as reactive-ion etching (RIE) or plasma etching. Thereafter, the photoresist mask may be removed. A metal fill may then be deposited to form the lower contact line 5. In some examples, the metal fill for the lower contact line 5 may be composed of tungsten (W), aluminum (Al), copper (Cu), titanium nitride (TiN), tantalum nitride (TaN), or combinations thereof. The metal fill may be deposited using physical vapor deposition (PVD), e.g., sputtering; plating, e.g., electroplating and/or electroless plating; chemical vapor deposition, atomic layer deposition (ALD); or a combination thereof. In some embodiments, the metal fill fills an entirety of the trench. In some embodiments, the structure may be planarized to remove the portions of the metal fill that may be present over the upper surface of the first dielectric layer 2. The planarization process may include chemical mechanical planarization, a reactive ion etching process (RIE), or a combination thereof.

Figure 3:
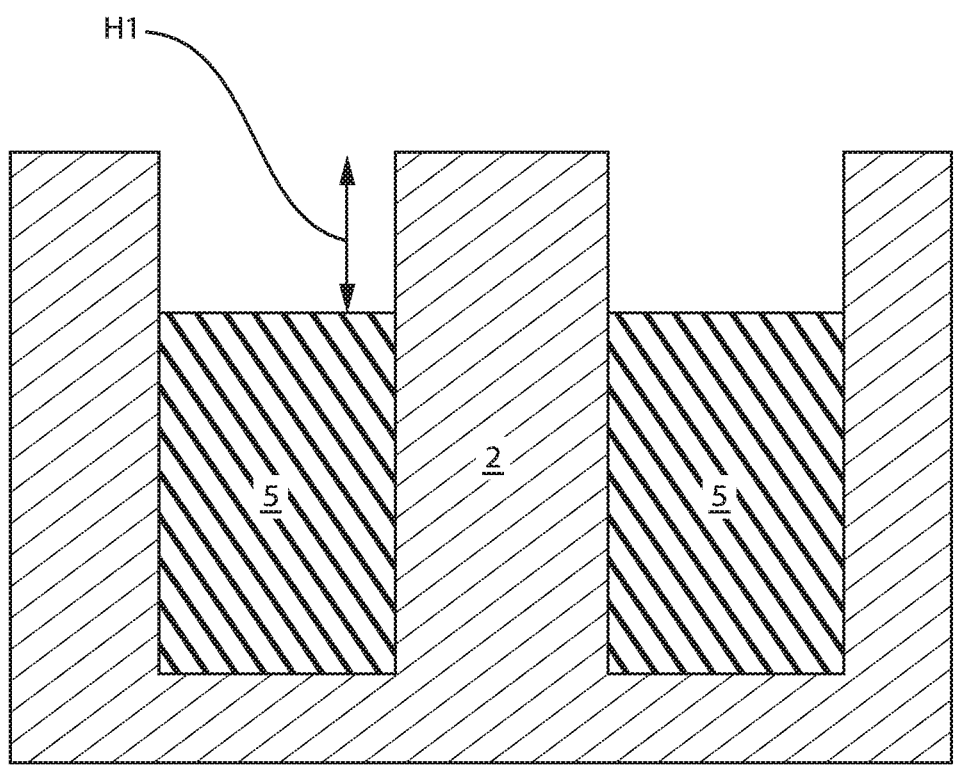
FIG. 3 is a side cross-sectional view depicting recessing the electrically conductive material of the lower contact line selectively to the first dielectric layer, in which the recessed formed houses the material for forming the lower electrode for the resistive random access memory (ReRAM) device.

FIG. 3 depicts recessing the electrically conductive material, i.e., metal fill, of the lower contact line 5 selectively to the first dielectric layer 2, in which the recess that is formed houses the material for forming the lower electrode 10 for the resistive random access memory (ReRAM) device. Recessing the metal fill that provides the lower contact line 5 may include an etch process, such as wet chemical etching or reactive ion etching (RIE). The etch process may be a selective etch process. As used herein, the term "selective" in reference to a material removal process denotes that the rate of material removal for a first material, e.g., the metal fill for the lower contact line 5, is greater than the rate of removal for at least another material, e.g., the first dielectric layer 2, of the structure to which the material removal process is being applied. For example, in one embodiment, a selective etch may include an etch chemistry that removes a first material selectively to a second material by a ratio of 10:1 or greater.

The etch process may be a wet chemical etch, or a dry etch. The etch process for recessing the metal fill that provides the lower contact line 5 may be an anisotropic etch process. As used herein, an "anisotropic etch process" denotes a material removal process in which the etch rate in the direction normal to the surface to be etched is greater than in the direction parallel to the surface to be etched. The anisotropic etch process may be provided by reactive ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation. The reactive ion etching (RIE) chemistry may include Ar, He, Xe, $Cl_2$, HCl, HBr, $CF_4$, $SF_6$, etc., their mixtures and combinations thereof.

In some embodiments, the metal fill of the lower contact line 5 is recessed to a depth H1 (measured from the upper surface of the first dielectric layer 2) that can range from 15 nm to 60 nm. In another embodiment, the metal fill of the lower contact line 5 is recessed to a depth H1 that can range from 20 nm to 50 nm. In yet another embodiment, the metal fill of the lower contact line 5 is recessed to a depth H1 that can range from 25 nm to 45 nm.

Recessing the metal fill, provides an opening, i.e., recess, atop the first contact line 5. The recess is defined by the recessed upper surface of the first contact line 5, and the sidewalls of the first dielectric layer 2 that are exposed by recessing the metal fill of the first contact line 5.

Figure 4:
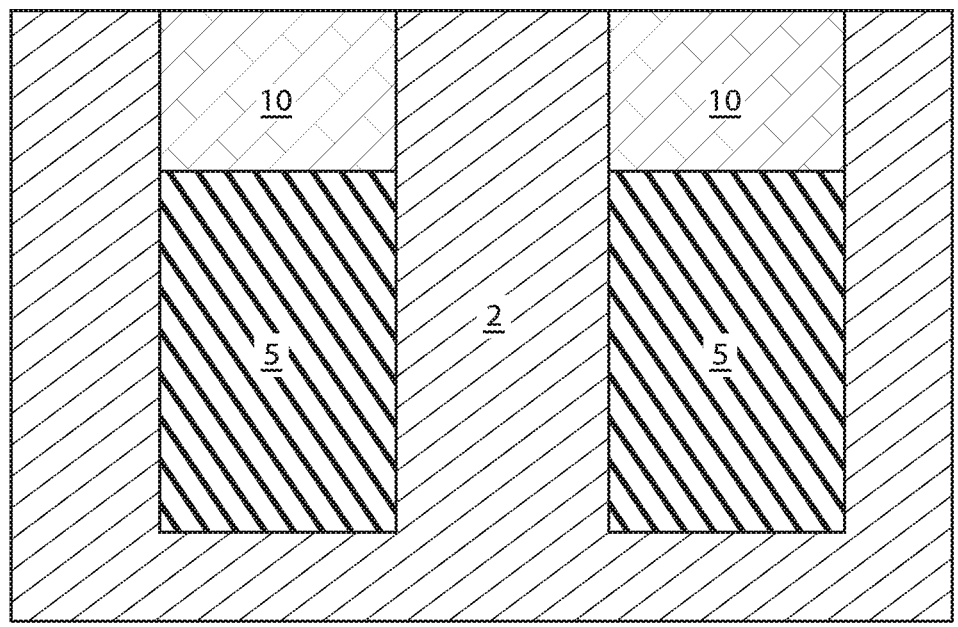
FIG. 4 is a side cross-sectional view depicting forming the electrically conductive material for the lower electrode to the resistive element of the resistive random access memory device, in which the electrically conducive material is formed filling the recess depicted in FIG. 3.

FIG. 4 depicts forming the electrically conductive material for the lower electrode 10 to the resistive cell 25 of the resistive random access memory device, in which the electrically conducive material is formed filling the recess depicted in FIG. 3. The electrically conductive material that provides the lower electrode 10 may be composed of any electrically conductive material that can fill the recess depicted in FIG. 3. For example, the electrically conductive material for the lower electrode 10 may be composed of tantalum (Ta), titanium (Ti), tungsten (W), ruthenium (Ru), and combinations and alloys thereof. In some examples, a nitride, e.g., titanium nitride (TiN), tantalum nitride (TaN), tungsten nitride and/or (WN), of one of the aforementioned metal examples can provide the composition for the electrically conductive material for the lower electrode 10.

In some preferred examples, the lower electrode 10 to the resistive cell 25 of the resistive random access memory device may be composed of a metal containing composition selected from the group consisting of ruthenium (Ru), titanium nitride (TiN), tungsten (W), tantalum nitride (TaN) and combinations thereof.

Because the lower electrode 10 is formed within a recess in the upper portion of the trench in which the lower contact line 5 was formed, the sidewalls of the lower electrode 10 and the lower contact line 5 are aligned to one another at one portion of the lower contact line 5. The lower electrode 10 can be referred to as a metal fin electrode.

Figure 5:
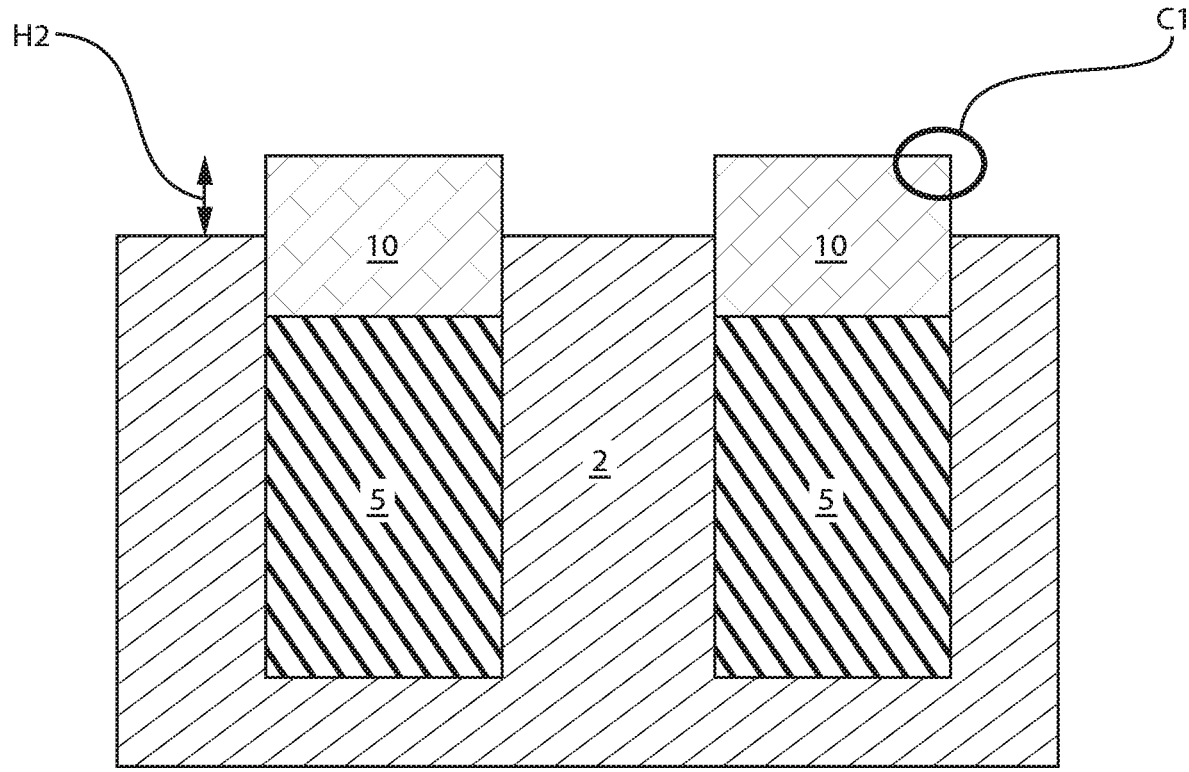
FIG. 5 is a side cross-sectional view depicting recessing the first dielectric layer to expose corners of the lower electrode to provide that the current conducting filaments are preferentially formed.

FIG. 5 depicts recessing the insulating material layer, i.e., first dielectric layer 2, to expose the corners C1 of the lower electrode 10 to provide that the current conducting filaments are preferentially formed. Recessing the first dielectric layer 2 may include an etch process, such as wet chemical etching or reactive ion etching (RIE). The etch process may be a selective etch process. For example, the etchant of the etch process may be selected to remove the material of the first dielectric layer 2 without etching, i.e., removing, the material of the lower electrode 10. The etch process may be a wet chemical etch, or a dry etch, such as reactive ion etching (RIE). When reactive ion etching (RIE) is employed to recess, the first dielectric layer 2, and expose the corners C1 of the upper portion of the lower electrode 10, the reactive ion etching (RIE) chemistry may include Ar, He, Xe, $Cl_2$, HCl, HBr, $CF_4$, $SF_6$, etc., their mixtures and combinations thereof.

In some embodiments, the first dielectric layer 2 recessed to a depth H2 (measured from the upper surface of the lower electrode 10 that can range from 10 nm to 50 nm. In another embodiment, the first dielectric layer 2 is recessed to a depth H2 (measured from the upper surface of the lower electrode 10) that can range from 20 nm to 50 nm. In yet another embodiment, the first dielectric layer 2 is recessed to a depth H2 (measured from the upper surface of the lower electrode 10 that can range from 10 nm to 20 nm. It is noted that the dimension H2 depicted in FIG. 5 is generally less than the dimension H1 depicted in FIG. 3.

Figure 6:
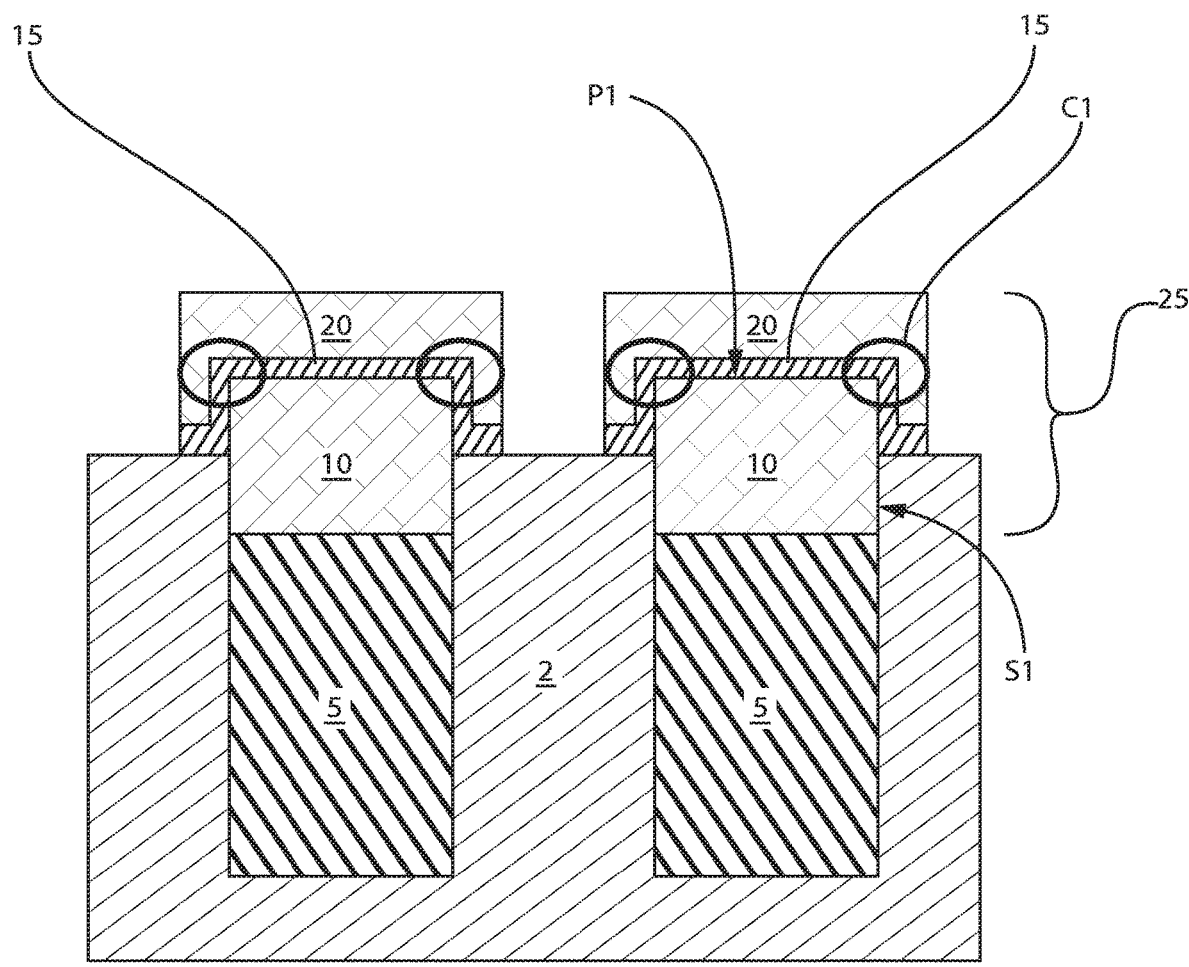
FIG. 6 is side cross-sectional view depicting one embodiment of forming a metal oxide layer atop the lower electrode, and forming an upper electrode atop the metal oxide layer providing the resistive cell of the resistive random access memory device, in accordance with one embodiment of the present disclosure.

FIG. 6 depicts one embodiment of forming a metal oxide layer 15 atop the lower electrode 10, and forming an upper electrode 20 atop the metal oxide layer 15 providing the resistive cell of the resistive random access memory device. In some embodiments, the process flow for this step may include conformally depositing a blanket layer for the metal oxide layer followed by depositing a material layer for the upper electrode 20. Thereafter, the stack of the material layer for the upper electrode 20 and the material layer for the metal oxide layer 15 are patterned using photolithography and etched to provide the geometries depicted in FIG. 6. In a following step, the second dielectric layer 3 is blanked deposited and planarized to provide that the upper surface of the second dielectric layer 3 is coplanar with the upper surface of the upper electrode 20.

In some embodiments, a metal oxide layer 15 is formed that provides a filament forming layer for the memory device, and is present in direct contact with the lower electrode 10. The metal oxide layer 15 may be deposited using a conformal deposition process. The term "conformal" denotes a layer having a thickness that does not deviate from greater than or less than 30% of an average value for the thickness of the layer. The metal oxide layer 15 may be formed using chemical vapor deposition (CVD), such as plasma enhanced chemical vapor deposition, and/or atomic layer deposition (ALD). In some embodiments, the metal oxide layer 15 is composed of a composition selected from the group consisting of hafnium oxide ($HfO_2$), tantalum oxide ($Ta_2O_5$), titanium oxide ($TiO_2$), tungsten oxide ($WO_3$), zirconium oxide ($ZrO_2$), aluminum oxide ($Al_2O_3$), strontium titanium oxide ($SrTiO_3$) and combinations thereof. The metal oxide layer 15 is formed on the upper surface of the lower electrode 10, as well as the sidewalls of the lower electrode 10 that extend above the first dielectric layer 2. The metal oxide layer 15 is blanket deposited, and therefore, also initially present atop the upper surface of the first dielectric layer 2.

The metal oxide layer 15 may have a thickness ranging from 1 nm to 15 nm. In one example, the metal oxide layer 15 may be composed of hafnium oxide ($HfO_2$), and may have a thickness ranging from 3 nm to 10 nm. For example the metal oxide conformal layer can be deposited by atomic layer deposition of $HfO_2$ using subsequent pulsed of $HfCl_4$ and $H_2O$ precursors.

Following the formation of the metal oxide layer 15, a blanket conformal material layer for the upper electrode 20 may be deposited using plating, e.g., electroplating and/or electroless plating; physical vapor deposition (PVD), such as sputtering; chemical vapor deposition (CVD), such as plasma enhanced chemical vapor deposition (PECVD) and/ or atomic layer deposition (ALD). In some embodiments, the upper electrode 20 can be composed of a metal containing composition selected from the group consisting of titanium nitride (TiN), tantalum nitride (TaN), (M)AlC, where M is a transition metal selected from the group consisting of Ti, Ta, and Nb, and combinations thereof. Similar to the metal oxide layer, the material layer for the upper electrode may be blanket deposited.

The stack of the material layer for the upper electrode 20 and the metal oxide layer 15 may be patterned and etched, using deposition, photolithography and etching. For example, a photoresist mask may be formed using deposition and photolithography steps similar to those described above for forming the lower contact line 5. Once an etch mask is formed, the stack of the upper electrode 20 and the metal oxide layer 15 may be etched. For example, the stack may be etched using an anisotropic etch, such as reactive ion etching. In some examples, the etch process may be selective to the first dielectric layer 2. In some embodiments, following etching, the remaining portions of the material layer for the upper electrode 20 and the metal oxide layer 15 have a width that is greater than the width of the underlying lower electrode 10 and lower contact line 5.

In a following process step, a material layer for the second dielectric layer 3 may be blanket deposited encapsulating the resistive elements 25 provided by the metal oxide layer 15, the upper electrode 20 and the lower electrode 10. The second dielectric layer 3 may be deposited using chemical vapor deposition, deposition from solution, spin on deposition and combinations thereof. Following deposition, a planarization process may be applied to the upper surface of the second dielectric layer 3 to provide that the upper surface of the second dielectric layer 3 is coplanar with an upper surface of the upper electrode 20, hence providing that the upper surface of the upper electrode is exposed.

Referring to FIG. 1B, in a following process step, the upper contact line 30 is formed in electrical communication with the exposed upper surface of the upper electrode 20. Forming the upper contact line 30 may be provided by depositing a dielectric layer; forming a line trench in the dielectric layer exposing the planarized surface of the random access memory (ReRAM) cell 100; and depositing an electrically conductive material, e.g., metal, within the line trench to provide the upper contact line 30.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

Having described preferred embodiments of a resistive random access memory (ReRAM) with metal fin electrode (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A memory device comprising:
   a lower electrode with a rectangular cross-sectional geometry having an upper portion extending above an upper surface of a first dielectric layer, wherein the upper portion of the lower electrode has upper corners of the rectangular cross-sectional geometry that are exposed;

a metal oxide layer having a conformal thickness present on sidewalls of the upper portion of the lower electrode, the metal oxide layer being present on at least the upper corners of the rectangular cross-sectional geometry for the lower electrode that extend above the first dielectric layer, wherein the metal oxide layer is composed of a composition selected from the group consisting of tantalum oxide ($Ta_2O_5$), titanium oxide ($TiO_2$), tungsten oxide ($WO_3$), zirconium oxide ($ZrO_2$), aluminum oxide ($Al_2O_3$), strontium titanium oxide ($SrTiO_3$) and combinations thereof; and an upper electrode present on the metal oxide layer, the upper electrode being separated from an entirety of the lower electrode by the metal oxide layer, the upper electrode having a width greater than the lower electrode and a planar outer sidewall that is aligned with an outer edge of the metal oxide layer, wherein the corners localize filament formation in the metal oxide layer, wherein the filament formation controls resistance across the metal oxide layer for storing a bit of information in the memory device.

2. The memory device of claim 1, wherein the lower electrode, metal oxide layer, and the upper electrode provide the resistive cell of a resistive random access memory device.

3. The memory device of claim 1, wherein the lower electrode, the metal oxide layer and the upper electrode provide a resistive random access memory cell of the memory device that is positioned between a lower contact line and an upper contact line orientated to provide a cross-bar architecture.

4. The memory device of claim 1, wherein the lower electrode is composed of a metal containing composition selected from the group consisting of ruthenium (Ru), titanium nitride (TiN), tungsten (W), tantalum nitride (TaN) and combinations thereof.

5. The memory device of claim 3, wherein the lower electrode is in direct contact with a lower contact line of the cross-bar architecture.

6. The memory device of claim 1, wherein the metal oxide layer has said conformal thickness ranging from 1 nm to 15 nm.

7. The memory device of claim 3, wherein the upper electrode is composed of a metal containing composition selected from the group consisting of titanium nitride (TiN), tantalum nitride (TaN), carbide of aluminum (AlC), metal-containing carbide of aluminum (M)AlC, where M is a transition metal selected from the group consisting of Ti, Ta, and Nb, and combinations thereof.

8. The memory device of claim 7, wherein the upper electrode is in direct contact with an upper contact line of the cross-bar architecture.

9. A memory device comprising:

a lower electrode with a rectangular cross-sectional geometry present on a lower contact line, the lower electrode having an upper portion extending above an upper surface of a first dielectric layer, wherein the upper portion of the lower electrode has upper corners of the rectangular cross-sectional geometry that are exposed;

a metal oxide layer having a conformal thickness present on sidewalls of the upper corners of the rectangular cross-sectional geometry for the lower electrode, the metal oxide layer being present on at least the corners of the lower electrode that extend above the first dielectric layer, wherein the metal oxide layer is composed of a composition selected from the group consisting of tantalum oxide ($Ta_2O_5$), titanium oxide ($TiO_2$), tungsten oxide ($WO_3$), zirconium oxide ($ZrO_2$), aluminum oxide ($Al_2O_3$), strontium titanium oxide ($SrTiO_3$) and combinations thereof;

an upper electrode present on the metal oxide layer, the upper electrode being separated from an entirety of the lower electrode by the metal oxide layer, the upper electrode having a width greater than the lower electrode and a planar outer sidewall that is aligned with an outer edge of the metal oxide layer, wherein the corners localize filament formation in the metal oxide layer, the filament formation controls resistance across the metal oxide layer for storing a bit of information in the memory device; and an upper contact line present on the upper electrode, wherein the lower contact line and the upper contact line are orientated to provide a cross-bar architecture.

10. The memory device of claim 9, wherein the lower electrode is composed of a metal containing composition selected from the group consisting of ruthenium (Ru), titanium nitride (TiN), tungsten (W), tantalum nitride (TaN) and combinations thereof.

11. The memory device of claim 9, wherein the upper electrode is composed of a metal containing composition selected from the group consisting of titanium nitride (TiN), tantalum nitride (TaN), carbide of aluminum (AlC), metal-containing carbide of aluminum (M)AlC, where M is a transition metal selected from the group consisting of Ti, Ta, and Nb, and combinations thereof.

* * * * *